United States Patent
Suzuki et al.

(10) Patent No.: US 6,578,891 B1
(45) Date of Patent: Jun. 17, 2003

(54) SUBSTRATE HOLDER AND SUBSTRATE TRANSFER APPARATUS USING THE SAME

(75) Inventors: Hiroo Suzuki, Kanagawa-ken (JP); Kenya Ito, Kanagawa-ken (JP); Kunihiko Sakurai, Kanagawa-ken (JP); Satoshi Wakabayashi, Kanagawa-ken (JP); Tetsuji Togawa, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/612,212

(22) Filed: Jul. 7, 2000

(30) Foreign Application Priority Data

Jul. 8, 1999 (JP) .......................... 11-194923
Jun. 19, 2000 (JP) ........................ 2000-183137

(51) Int. Cl.[7] .......................... B25J 15/00; B65G 49/07
(52) U.S. Cl. .................... 294/64.1; 294/907; 414/941
(58) Field of Search .................. 294/64.1, 907; 414/941

(56) References Cited

U.S. PATENT DOCUMENTS

| | | | |
|---|---|---|---|
| 4,720,130 A | * | 1/1988 | Andou .................. 294/907 |
| 5,191,218 A | * | 3/1993 | Mori et al. ............. 294/907 |
| 5,359,785 A | | 11/1994 | Fukutomi et al. |
| 5,626,675 A | | 5/1997 | Sakamoto et al. |
| 5,711,646 A | * | 1/1998 | Ueda et al. ............. 294/64.1 |
| 5,796,486 A | | 8/1998 | Jacob |
| 5,893,794 A | | 4/1999 | Togawa et al. |
| 5,961,380 A | | 10/1999 | Togawa et al. |
| 6,113,165 A | * | 9/2000 | Wen et al. .............. 294/907 |
| 6,117,238 A | * | 9/2000 | Begin .................... 414/941 |
| 6,244,641 B1 | * | 6/2001 | Szapucki et al. ....... 294/64.1 |
| 6,280,291 B1 | | 8/2001 | Gromko et al. |
| 6,322,119 B1 | * | 11/2001 | Schmidt et al. ........ 414/941 |

FOREIGN PATENT DOCUMENTS

| | | |
|---|---|---|
| JP | 4-340245 | 11/1992 |
| JP | 3-337802 | 6/1993 |
| JP | 7-232802 | 9/1995 |
| JP | 7-235581 | 9/1995 |
| JP | 10-177999 | 6/1998 |
| WO | 99/16111 | 4/1999 |

* cited by examiner

*Primary Examiner*—John M. Jillions
(74) *Attorney, Agent, or Firm*—Wenderoth, Lind & Ponack, L.L.P.

(57) ABSTRACT

The present invention provides a substrate holder for holding and transferring a thin substrate, comprising a substrate support member having a recessed area for placing a thin substrate therein and substrate mount portions formed in the recessed area in the vicinity of a circumferential edge thereof. The substrate mount portions is adapted to be engaged with an outer circumferential portion of a backside of the substrate placed in the recessed area. The substrate holder further comprises a substrate detector for detecting presence or absence of the substrate in the recessed area.

21 Claims, 13 Drawing Sheets

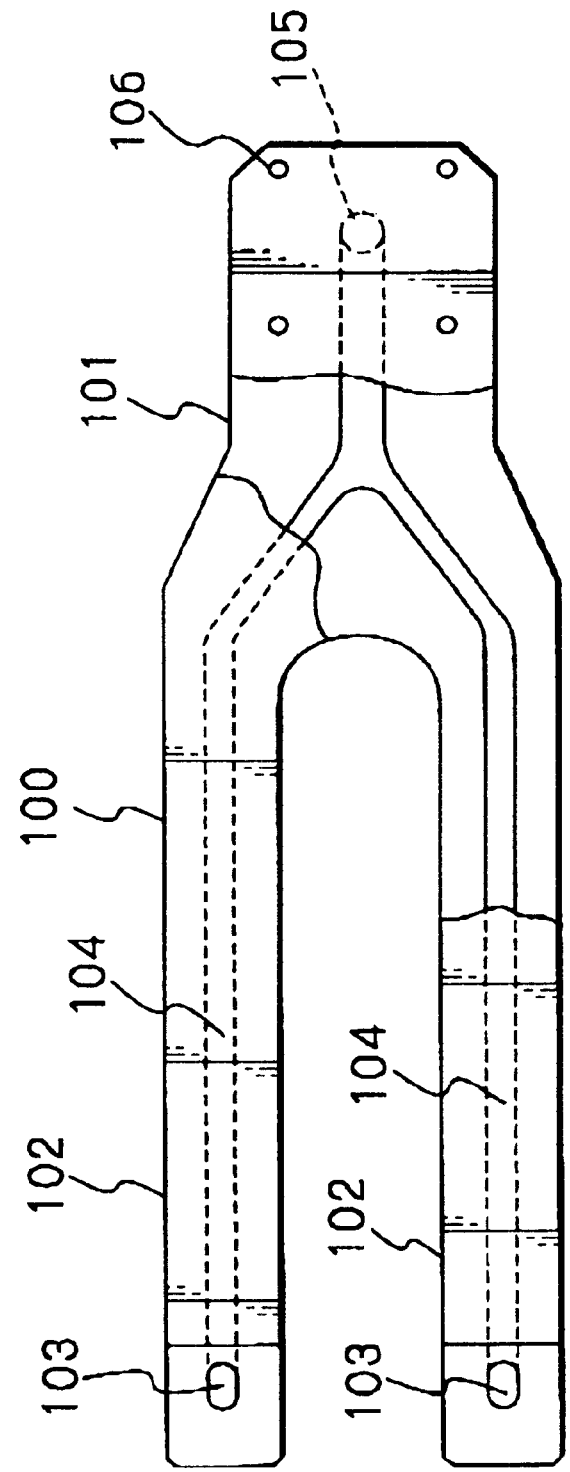
Fig. 1a PRIOR ART
Fig. 1b PRIOR ART

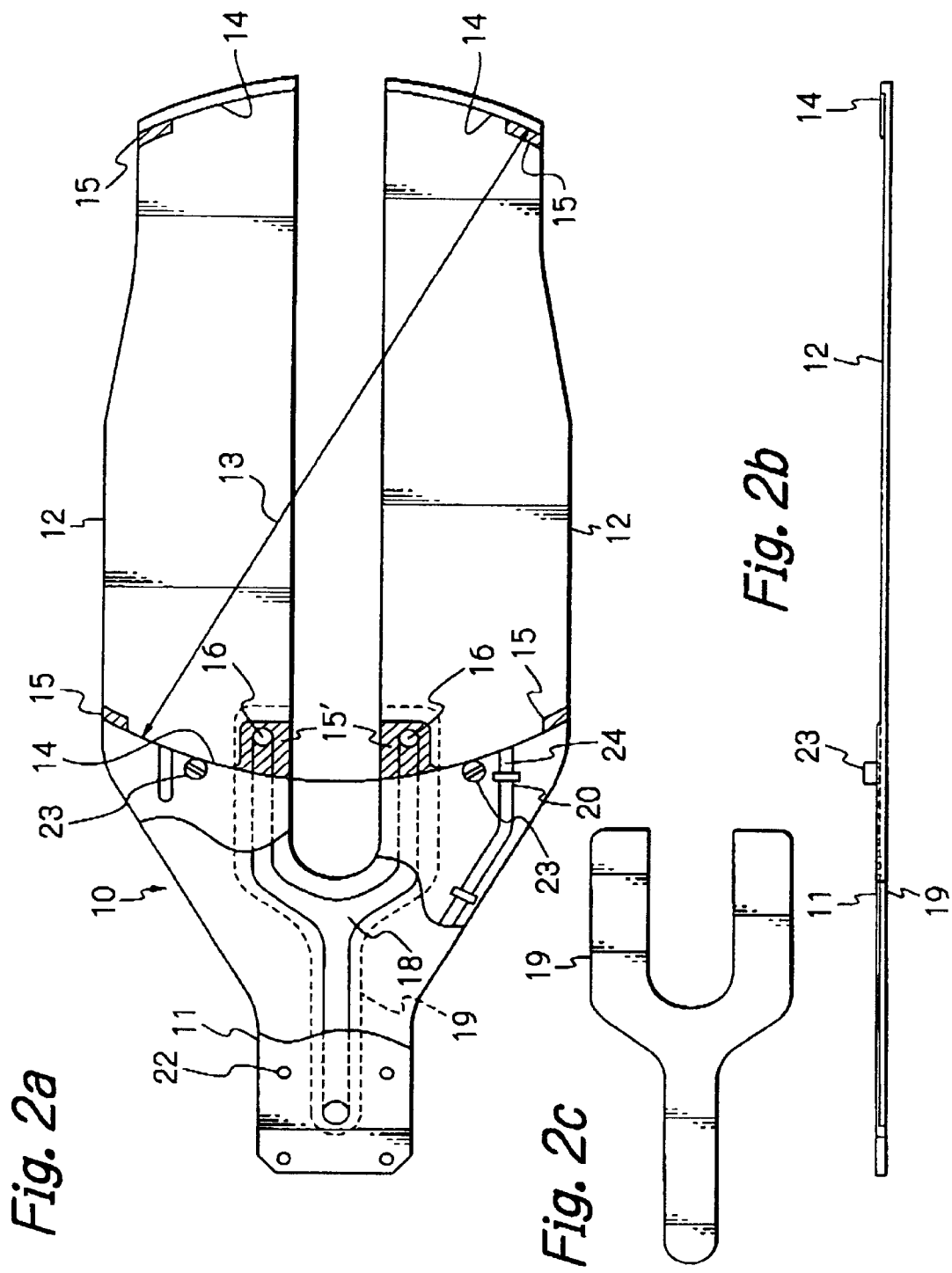

SUBSTRATE HOLDER AND SUBSTRATE TRANSFER APPARATUS USING THE SAME

BACKGROUND OF THE INVENTION

The present invention relates to a substrate holder which is mounted on a substrate transfer apparatus, such as a robot, for holding and transferring a thin substrate such as a semiconductor wafer. The present invention also relates to a substrate transfer apparatus using the above-mentioned substrate holder.

FIGS. 1(a)–1(b) show an arrangement of a conventional substrate holder of the above-mentioned type. FIG. 1a is a plan view and FIG. 1(b) is a side view. As shown in FIG. 1(a), the conventional substrate holder comprises a substrate support member 100 including a base portion 101 and finger portions 102 extending from the base portion 101 in a bifurcated form. Each finger portion 102 includes a vacuum opening 103 at a forward end portion thereof Further, a vacuum passage 104 extends through the finger portion 102 so as to communicate with the opening 103. The respective vacuum passages 104 of the finger portions 102 join at the base portion 101 and communicate with an opening 105 which in turn communicates with a vacuum system (not shown).

In the above-mentioned substrate holder, a substrate is held by means of suction. Illustratively stated, a thin substrate (not shown), such as a semiconductor wafer, is provided in the holder so that a central portion of a backside of the substrate abuts against the vacuum openings 103 of the finger portions 102. A vacuum pressure is applied through the openings 103, thus holding the substrate on the finger portions 102. In FIG. 1(a), reference numeral 106 denotes a bolt opening. The substrate holder is fixed to a forward end of a robot (not shown) by passing bolts through the openings 106.

As mentioned above, in the conventional substrate holder, the central portion of the backside of the substrate is suctioned onto the finger portions 102. Therefore, a problem arises, such that when breakage of a vacuum source occurs during transfer of a substrate, a vacuum pressure cannot be applied to the substrate, with the result that the substrate is likely to fall from the substrate holder and break. Further, particles floating in air are collected at the portion of the substrate to which the vacuum pressure is applied, leading to contamination of the substrate. These particles adversely affect the manufacture of chips for semiconductors and therefore the amount thereof should be minimized.

Further, when the speed of transfer (the speed of movement of the substrate holder) is increased so as to achieve a reduction in tact time, a force which horizontally moves the substrate becomes large, so that the substrate mounted on the holder is displaced. Therefore, the substrate cannot be delivered accurately to a target position, so that there is a risk of damage to the substrate.

In recent years, in semiconductor manufacturing apparatuses, it has been strongly desired to prevent contamination of semiconductor substrates. Conventionally, preventing only contamination of a patterned surface was satisfactory, but with a recent tendency to reduce wiring line widths of devices, contamination of the backside of a substrate has also become problematic. In a conventional substrate holder in which a suction is utilized, contaminants are collected at a portion of the substrate to which vacuum is applied from the holder, leading to a high risk of contamination.

As a measure to obviate the above-mentioned problem of contamination, it is considered to employ a recessed type substrate holder comprising a substrate support member having a recessed area for placing a semiconductor substrate therein. However, when a semiconductor substrate is removed from a cassette case, the semiconductor substrate is not always positioned at a regular position in the cassette case, that is, a position where the center of the substrate and the center of the cassette case coincide with each other. That is, the substrate can be displaced from the regular position in the cassette case. In this case, when use is made of a substrate holder having a portion formed in a certain configuration for receiving a substrate, such as the above-mentioned conventional substrate holder, defective transfer due to displacement of the substrate is likely to occur.

SUMMARY OF THE INVENTION

In view of the above, the present invention has been made. It is an object of the present invention to provide a substrate holder which is free from the above-mentioned problems. The substrate holder of the present invention is capable of suppressing contamination of a substrate due to particles, eliminating the risk of breakage of a substrate falling from the holder, receiving a substrate accurately even when it is displaced from a regular position and delivering the substrate accurately to a regular position. It is another object of the present invention to provide a substrate transfer apparatus using the above-mentioned substrate holder.

In accordance with the present invention, there is provided a substrate holder for holding and transferring a thin substrate, comprising a substrate support member having a recessed area for receiving a thin substrate therein and substrate mount portions formed in the recessed area in the vicinity of a circumferential edge thereof. The substrate mount portions are adapted to be engaged with an outer circumferential portion of a substrate placed in the recessed area. The substrate holder also includes a substrate detector for detecting presence or absence of the substrate in the recessed area.

In the substrate holder, there is little risk of displacement of the substrate and breakage of the substrate due to falling from the holder. Further, only the outer circumferential portion of the backside of the substrate abuts against the substrate mount portion, so that it is possible to suppress contamination of the substrate due to deposition of particles at a portion of the backside of the substrate which does not abut against the substrate mount portion.

The substrate detector may comprise at least one detection means selected from a first detection means and a second detection means and a second detection means. The first detection means includes a substrate detecting portion which is formed in the recessed area in the vicinity of a circumferential edge thereof. The substrate detecting portion has surface with which the outer circumferential portion of the backside of the substrate received in the recessed area is engaged, and a fluid passage is provided in the substrate holder and has an opening formed in the stated surface of the substrate detecting portion. The first detection means is adapted to detect presence or absence of the substrate by detecting a pressure in the stated opening. The second detection means is a non-contact type which detects presence or absence of the substrate in the recessed area without making contact with the substrate.

In the substrate holder, a fluid such as clean air or $N_2$ gas is flowed at a low rate through the opening of the fluid passage to the outside. The presence or absence of the substrate is detected by detecting whether or not a change in pressure occurs due to closing of the opening by the substrate. Differing from the conventional technique in which the presence or absence of the substrate is detected according to a change in vacuum pressure, in the substrate holder, there is no possibility of contamination of a substrate due to collection of particles floating in air. Further, when the detector is a non-contact type, such as a photoelectric sensor, the detector detects the presence or absence of the substrate in the recessed area without making contact with the substrate. This enables rapid detection of displacement of the substrate during transfer and is advantageous in preventing breakage of the substrate due to it falling from the holder. Further, when the opening of the fluid passage is connected to a vacuum source during transfer of the substrate, lifting of the substrate (hence displacement of the substrate) can be prevented. In this case, a high vacuum pressure is not required and only the outer circumferential portion of the backside of the substrate is suctioned, so that contamination of the substrate due to particles can be suppressed.

According to another aspect of the present invention, provided is a substrate holder for holding and transferring a thin substrate. This substrate holder comprises a substrate support member having a recessed area for placing a thin substrate therein, and substrate amount portions formed in the recessed area in the vicinity of a circumferential edge thereof The substrate mount portions are adapted to be engaged with an outer circumferential portion of a backside of the substrate. The substrate support member has a first portion adapted to be connected to a substrate transfer apparatus and a second portion in which the recessed area is formed. The second portion includes a proximal section close to the first portion with a large width and a distal section apart from the first portion with a small width.

The holder is advantageous in receiving a substrate from a cassette case of which an inner width is limited and delivering the substrate to such a cassette case, and enables the substrate to be stably held on the holder.

According to another aspect of the present invention, a substrate holder comprises a substrate support member having a recessed area for placing the substrate therein. The substrate support member has a first portion adapted to be connected to a substrate transfer apparatus and a second portion in which the recessed area is formed. The second portion includes a proximal portion close to the first portion and a distal section apart from the first portion. The proximal portion is thicker than the distal portion. This arrangement enables lightening of the substrate support member.

According to a further aspect of the present invention, a substrate holder comprises a substrate support member having a recessed area for receiving the substrate therein and an aligning mechanism adapted to perform a function such that when the substrate support member is moved to a position where a substrate should be placed in order to receive the substrate, and when the substrate is actually displaced from the position, the aligning mechanism moves the substrate to the position thereby enabling the substrate support member to receive the substrate appropriately.

Specifically, the aligning mechanism comprises an aligning member provided outside and in the vicinity of the recessed area of the substrate support member in such a manner that when the substrate support member is moved towards an area below the substrate so as to receive the substrate, the aligning member engages and moves the substrate to the above-stated position.

Further, the present invention provides a substrate transfer apparatus that comprises a substrate holder such as stated above.

Furthermore, the present invention provides a substrate transfer apparatus suitable for use in a substrate treatment apparatus including a substrate loading/unloading station and a substrate treatment station where the substrate is treated. The substrate transfer apparatus comprises a first substrate holder for holding a pre-treatment substrate by means of suction and transferring the pre-treatment substrate to the substrate treatment station, a second substrate holder for holding a post-treatment substrate which has been treated in the substrate treatment station to return the post-treatment substrate to return the post-treatment substrate to the loading/unloading station. The second substrate holder comprises a substrate support member having a recessed area for placing the post-treatment substrate therein and substrate mount portions formed in the recessed area in the vicinity of a circumferential edge thereof The substrate mount portions are adapted to be engaged with an outer circumferential portion of a backside of the post-treatment substrate placed in the recessed area. The second substrate holder also includes a substrate detector for detecting presence or absence of the post-treatment substrate in the recessed area.

The present invention further provides a polishing apparatus comprising a loading/unloading station, a polishing station for polishing a substrate, a cleaning and-drying station for cleaning and drying the substrate polished in the polishing station, and a substrate transfer apparatus for transferring the substrate between the stated stations. The substrate transfer apparatus comprises a first substrate holder for holding a substrate, which has not been subjected to polishing in the polishing station, by means of suction and transferring the substrate to the polishing station, and a second substrate holder for holding a substrate, which has been polished in the polishing station, and returning the substrate to the loading/unloading station. The second substrate holder comprises a substrate support member having a recessed area for placing the substrate therein and substrate mount portions formed in the recessed area in the vicinity of a circumferential edge thereof The substrate mount portions are adapted to the engaged with an outer circumferential portion of a backside of the substrate placed in the recessed area. The second substrate holder also includes a substrate detector for detecting presence or absence of the substrate in the recessed area.

BRIEF DESCRIPTION OF THE DRAWINGS

FIG. 1a is a plan view of a conventional substrate holder.

FIG. 1b is a side view of the conventional substrate holder.

FIG. 2a is a plan view of a substrate holder of the present invention.

FIG. 2b is a side view of the substrate holder of the present invention.

FIG. 2c is a plan view of a reinforcing plate.

FIG. 4b is a cross-sectional view taken along the line A—A in FIG. 4a.

FIG. 6a is a plan view of another example of a substrate holder of the present invention.

FIG. 6b is a side cross-sectional view of FIG. 6a.

FIG. 6c is a cross-sectional view taken along the line D—D of FIG. 6a.

FIG. 6d is an enlarged view of a portion C of the substrate holder of FIG. 6a.

DETAILED DESCRIPTION OF THE INVENTION

Figure 3:
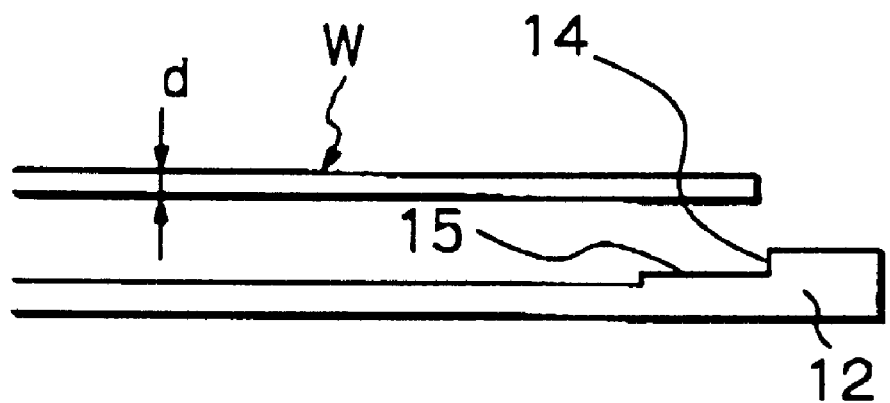
FIG. 3 is a cross-sectional view of a forward end portion of a substrate support member of the substrate holder of the present invention.

Hereinbelow, description is made with regard to embodiments of the present invention, referring to the drawings. In these embodiments, a substrate holder for handling a semiconductor wafer is taken as an example. However, the substrate to be handled in the present invention is not limited to a semiconductor wafer. Various thin substrates such as a glass substrate may be used.

FIGS. 2a to 2c show an arrangement of a substrate holder of the present invention. FIG. 2a and FIG. 2b are, respectively, a plan view and a side cross-sectional view of the substrate holder. FIG. 2c is a plan view of a reinforcing plate. As shown in FIG. 2a, the substrate holder comprises a substrate support member 10 including a base portion 11 and finger portions 12 extending from the base portion 11 in a bifurcated form. Each finger portion 12 includes a recessed area 14 for placing a semiconductor wafer therein. An Inner diameter 13 of the recessed area 14 is slightly larger than the diameter (outer diameter) of the semiconductor wafer, so that the wafer can be readily placed in the recessed area 14. Illustratively stated, when the diameter of the semiconductor wafer is 200 mm, the inner diameter 13 of the recessed area 14 is 202 mm.

A plurality of substrate mount portions 15 [four in FIG. 2a] are formed in the recessed area in the vicinity of circumferential walls defining the recessed area 14 of the substrate support member 10. An outer circumferential portion of a backside of the semiconductor wafer abuts against the substrate mount portions 15. The substrate support member 10 comprises, for example, a plate made of an alumina ceramic material. The thickness of the substrate support member 10 is minimized to about 2 mm, in consideration of limitations imparted due to removal and delivery of wafers relative to cassette cases, limitations due to manufacture and stiffness of the holder.

The substrate support member 10 removes and delivers semiconductor wafers relative to the cassette cases. Therefore, the portion of the substrate support member 10 at which the recessed area 14 is formed (a recessed area-forming portion) is configured, such that it has a larger width on a side of a robot arm to which the holder is to be mounted and a smaller width on a forward end portion thereof. By this arrangement, the substrate support member 10 can be stably removed from or inserted into the cassette cases of which inner widths are limited and a wafer can be stably held on the substrate support member 10.

The depth of the recessed area 14 for placing the wafer placed therein is generally equal to the thickness (about 0.725 mm) of a wafer W as shown in FIG. 3. By this arrangement, when the wafer W is placed in the recessed area 14 of the finger portions 12 of the substrate support member 10, the wafer W is unlikely to fall from the substrate support member 10. Further, in order to detect the presence or absence of the wafer W, substrate detecting portions 15' are provided in the recessed area in the vicinity of the circumferential walls thereof near the proximal end portions of the finger portions 12 of the substrate support member 10. An upper surface of the substrate detecting portion 15' and an upper surface of the substrate mount portion 15 are equal in height. A pressure detecting opening 16 having a small diameter is provided on the upper surface of each substrate detecting portion 15'. A pressure detecting minute passage 18 is formed within the base portion 11 and the finger portions 12 so as to communicate with the pressure detecting openings 16.

When the wafer W is received by the holder, a gas such as clean air or $N_2$ gas is flowed through the pressure detecting minute passage 18 to the pressure detecting openings 16 at a low flow rate. When the wafer W is mounted on the substrate mount portions 15 and closes the pressure detecting openings 16 of the substrate detecting portions 15', the pressure in the pressure detecting openings 16 and the pressure detecting minute passage 18 increases. The presence or absence of the wafer can be detected by detecting such an increase in pressure. Further, for example, when the pressure detecting minute passage 18 is switched to be connected to a vacuum source during transfer of the wafer W, lifting of the wafer W and horizontal displacement of the wafer W can be prevented due to the effect of suction. At the same time, by detecting the pressure in the pressure detecting minute passage 18, the presence or absence of the wafer W can be detected. Because the pressure detecting openings 16 are small in size, the flow rate of clean air or $N_2$ gas can be set to be low.

As mentioned above, when the semiconductor wafer is received, clean air or $N_2$ gas is flowing through the pressure detecting openings 16 to the outside at a low flow rate. Therefore, it is possible to suppress contamination of the wafer, which is likely to occur in the conventional technique shown in FIG. 1 where particles in air are collected at a portion of the wafer to which vacuum is applied.

The portion of the substrate support member 10 in which the pressure detecting minute passage 18 is formed has a low strength. Therefore, for reinforcement, a reinforcing member 19 made of stainless steel is fixedly attached to a backside of the portion of the finger portions 12 and base portion 11 in which the pressure detecting minute passage 18 is formed.

As mentioned above, the wafer W can be detected by detecting the pressure in the pressure detecting minute passage 18. Alternatively, the wafer W may be detected by utilizing a channel 20 and a photoelectric sensor 24 provided in the channel 20 as a sensor utilizing light. In this arrangement, the photoelectric sensor 24 detects the presence or absence of the wafer W in the recessed area 14 rapidly without making contact with the wafer W.

It is advantageous to provide both the substrate detection means using the pressure detecting openings 16 and the substrate detection means using the photoelectric sensor 24, because detection of the substrate at the time of receiving the substrate can be conducted by means of the pressure detecting openings 16 and detection of the presence or absence of the wafer W in the recessed area 14 during transfer can be conducted by the photoelectric sensor 24 while the pressure detecting minute passage 18 is connected to a vacuum source to thereby suppress lifting of the wafer W. However, it is unnecessary to provide both of the above-mentioned substrate detection means, and either one of the substrate detection means may be provided. Further, as a means to detect the substrate, various sensors may be used instead of the photoelectric sensor. Examples of such sensors include a proximity sensor which detects the presence or absence of the wafer according to the magnitude of capacitance and a sensor of a non-contact type which detects the wafer W by means of for example, magnetism.

Figure 4A:
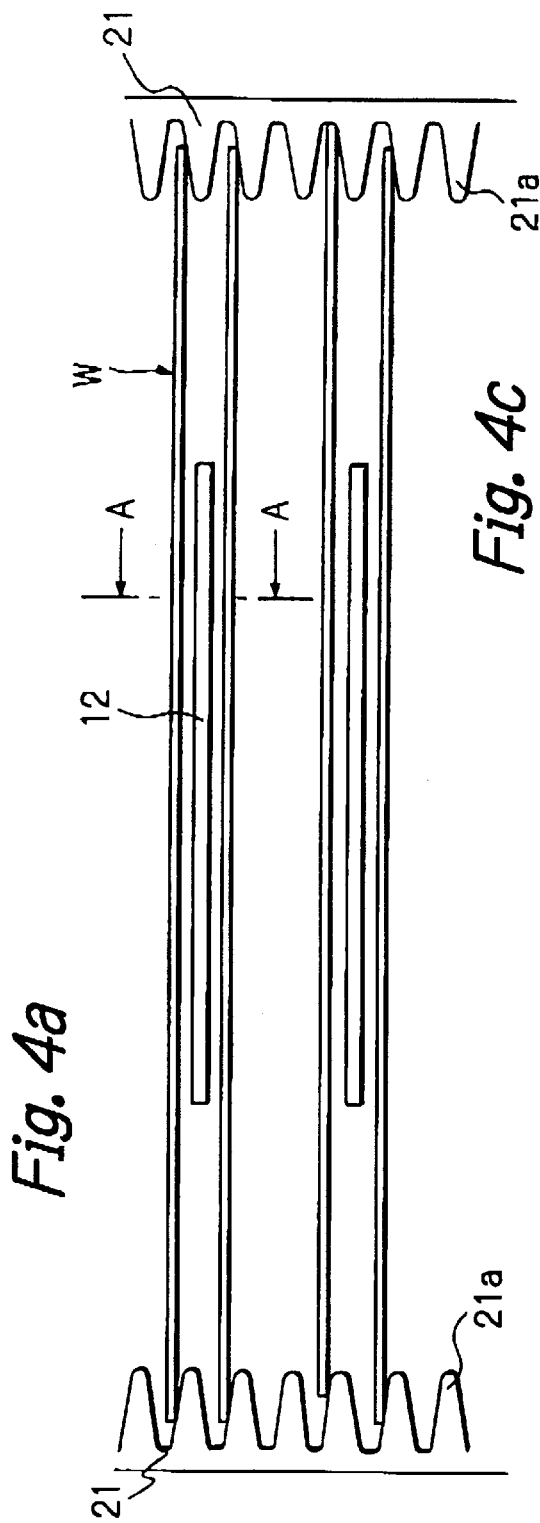
FIG. 4a is a front view of a part of a cassette case, showing a relationship between the substrate holder of the present invention and a semiconductor wafer contained in the cassette case.

The substrate holder arranged as mentioned above is fixed to a forward end of a robot arm by passing bolts through bolt openings 22 for fastening. Then, as shown in FIG. 4a. the substrate holder connected to the robot arm is inserted into an area between the wafers W contained in a cassette case 21. The holder is then moved upward, so that the outer circumferential portion of the backside of the wafer W abuts against the substrate mount portions 15 in the recessed area 14, and the wafer W is placed in the recessed area 14.

Figure 4C:
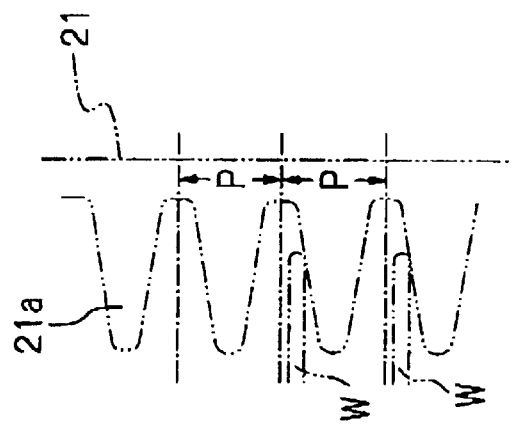
FIG. 4c shows a cross-sectional view of a part of a side wall of the cassette case.
Figure 4B:
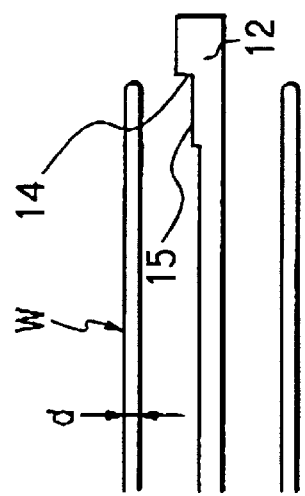

By this arrangement, the wafer W can be safely transferred to a place for subsequent treatment without any risk of breakage due to falling from the holder. After treatment, the wafer W is placed in the recessed area 14 of the finger portions 12 of the substrate support member 10 and, while the outer circumferential portion of the backside of the wafer W is held on the substrate mount portions 15, the wafer W is safely transferred to a cassette case and accommodated therein. FIG. 4b is a cross-sectional view taken along the line A—A in FIG. 4a and FIG. 4c shows mount portions 21a for supporting end portions of the wafers W, which are formed in a wall of the cassette case 21. As shown in FIG. 4c, the mount portions 21a are formed at predetermined pitches P.

As mentioned above, in the substrate holder of the present invention, when a wafer W is placed in the recessed area 14 of the finger portions 12 of the substrate support member 10, the outer circumferential portion of the backside of the wafer W is held on the four substrate mount portions 15 provided in the vicinity of the circumferential walls defining the recessed area 14. Therefore, the substrate holder is capable of performing a wafer centering function and also capable of transferring the wafer quickly and accurately. Further, even when the wafer W contains a non-flat orientation, the substrate mount portions 15 at three positions in the recessed area 14 hold the outer circumferential portion of the backside of the wafer W, thus enabling centering of the wafer W. Further, the pressure detecting openings 16 of the substrate detecting portions 15' are positioned, such that the backside of the wafer W closes the pressure detecting opening 16 even when the position of a non-flat orientation of the wafer W coincides with the position of the pressure detecting opening 16.

Figure 5:
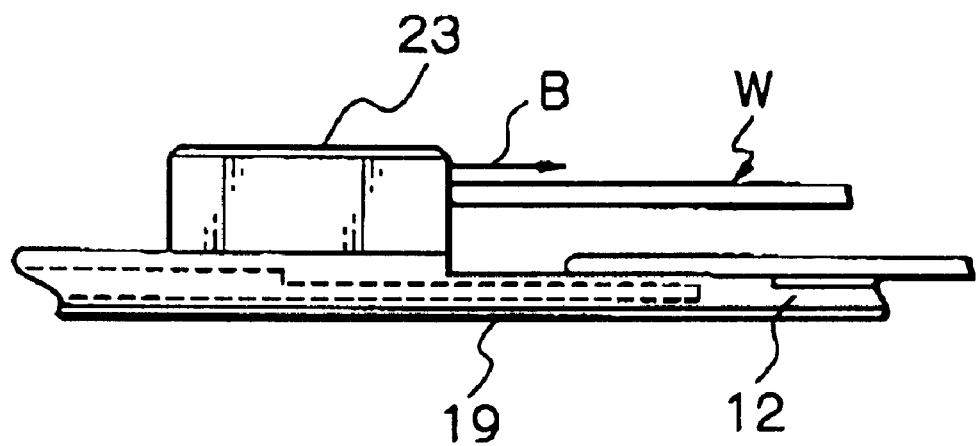
FIG. 5 shows how displacement of a semiconductor wafer is corrected by the substrate holder of the present Invention.

Two pins 23 are provided outside the peripheries of the recessed area 14 of the finger portions 12 of the substrate support member 10. As shown in FIG. 5, when an upper wafer W in a cassette case is displaced from a regular position toward the substrate holder and the finger portions 12 of the substrate support member 10 are inserted into the cassette case so as to remove or deliver a wafer below the wafer W, the upper wafer W is moved, by means of the pins 23, in a direction indicated by an arrow B and is accommodated at the regular position.

As mentioned above, in the substrate holder of the present invention, the recessed area 14 is formed in the finger portions 12 of the substrate support member 10 so that the wafer W is placed in the recessed area 14 and is stably held therein. Therefore, the wafer W can be held without using a vacuum source while eliminating the risk of displacement of the wafer or breakage of the wafer due to falling from the holder. Further, since the outer circumferential portion of the backside of the wafer W is held on a plurality of substrate mount portions 15 provided in the vicinity of the circumferential walls of the recessed area 14, the surface area of the wafer W in contact with the substrate holder can be reduced, thus making it possible to minimize contamination of the wafer W due to deposition of particles at the time of receiving the wafer.

The substrate detecting portions 15' for detecting the wafer W are positioned so that the outer circumferential portion of the backside of the wafer abuts against the substrate detecting portions 15'. The pressure detecting openings 16 are formed at the substrate detecting portions 15'. When the pressure detecting openings 16 are connected to a vacuum source, although the diameters of the pressure detecting openings 16 are minute, lifting of the wafer W can be suppressed due to the effect of suction, thereby preventing horizontal displacement of the wafer during transfer.

The pressure detecting openings 16 are provided at a position corresponding to the outer circumferential portion of the backside of the wafer W. Therefore, contamination of the wafer W due to contact with the substrate holder can be minimized, so that semiconductor chips can be obtained with a high yield. Further, even when the diameter of the wafer W increases, it is unnecessary to increase the diameters of the pressure detecting openings 16 and it is also unnecessary to increase the diameter of the pressure detecting minute passage 18 for detecting the wafer W. Therefore, the thickness of the substrate support member 10 can be reduced.

In the conventional substrate holder in FIGS. 1a and 1b, the vacuum openings 103 are formed at forward end portions of the finger portions 102 and the vacuum passages 104 are formed within the finger portions 102 and the base portion 101. In contrast, in the substrate holder of the present invention in FIGS. 2a–2c, the pressure detecting openings 16 are formed at the proximal end portions of the finger portions 12, that is, in the vicinity of the circumferential walls of the recessed area 14 and the pressure detecting minute passage 18 communicating with the pressure detecting openings 16 is formed in the finger portions 12 and the base portion 11. Therefore, the length of the pressure detecting minute passage 18 can be reduced, thus reducing the range of micromachining.

Figure 6:
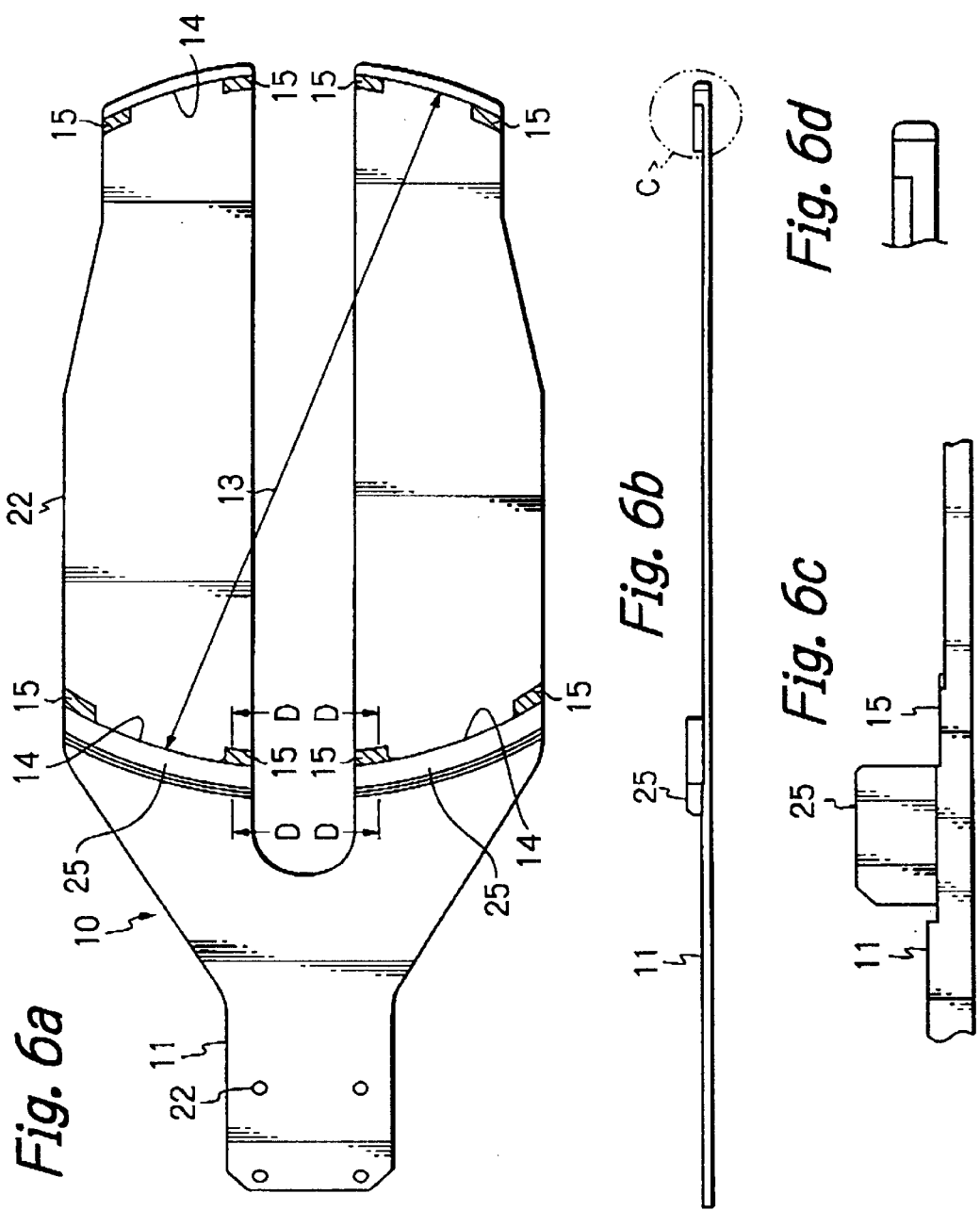

FIGS. 6a–6d show another example of an arrangement of the substrate holder of the present invention. FIG. 6a is a plan view, FIG. 6b is a side cross-sectional view, FIG. 6c is a cross-sectional view taken along the line D—D in FIG. 6a, and FIG. 6d is an enlarged view of a portion C in FIG. 6b. In FIGS. 6a–6d, the same portions as shown in FIGS. 2a–2c or the portions corresponding to those in FIGS. 2a–2c are designated by the same reference numerals as used in FIGS. 2a–2c. This substrate holder comprises the substrate support member 10 including the base portion 11 and the finger portions 12 extending from the base portion 11 in a bifurcated form. Each finger portion 12 has the recessed area 14 for placing a semiconductor wafer therein. The inner diameter 13 of the recessed area 14 is slightly larger than the diameter (outer diameter) of the semiconductor wafer so that the semiconductor wafer can be smoothly placed in the recessed area. These arrangements described so far are the same as those of the substrate holder in FIGS. 2a–2c.

A plurality of substrate mount portions 15 (eight in FIG. 6a are provided in the vicinity of the circumferential walls of the recessed area 14 of the substrate support member 10. An outer circumferential portion of a backside of the wafer abuts against the substrate mount portions 15. Reference numeral 25 denotes an aligning member providing an aligning mechanism. When a semiconductor wafer is disposed at a position deviating from a regular position in a cassette case, the wafer is positioned at (moved to) the regular position by the aligning mechanism. The inner periphery of the aligning member 25 is in an arcuate form and the radius of the aligning member 25 is determined in accordance with that of the outer periphery of the semiconductor wafer. The circumferential walls of the recessed area 14 of the substrate support member 10 and the inner circumferential surface of the aligning member 25 generally coincide with each other. The substrate support member 10 and the aligning member 25 define the recessed area 14.

Figure 7:
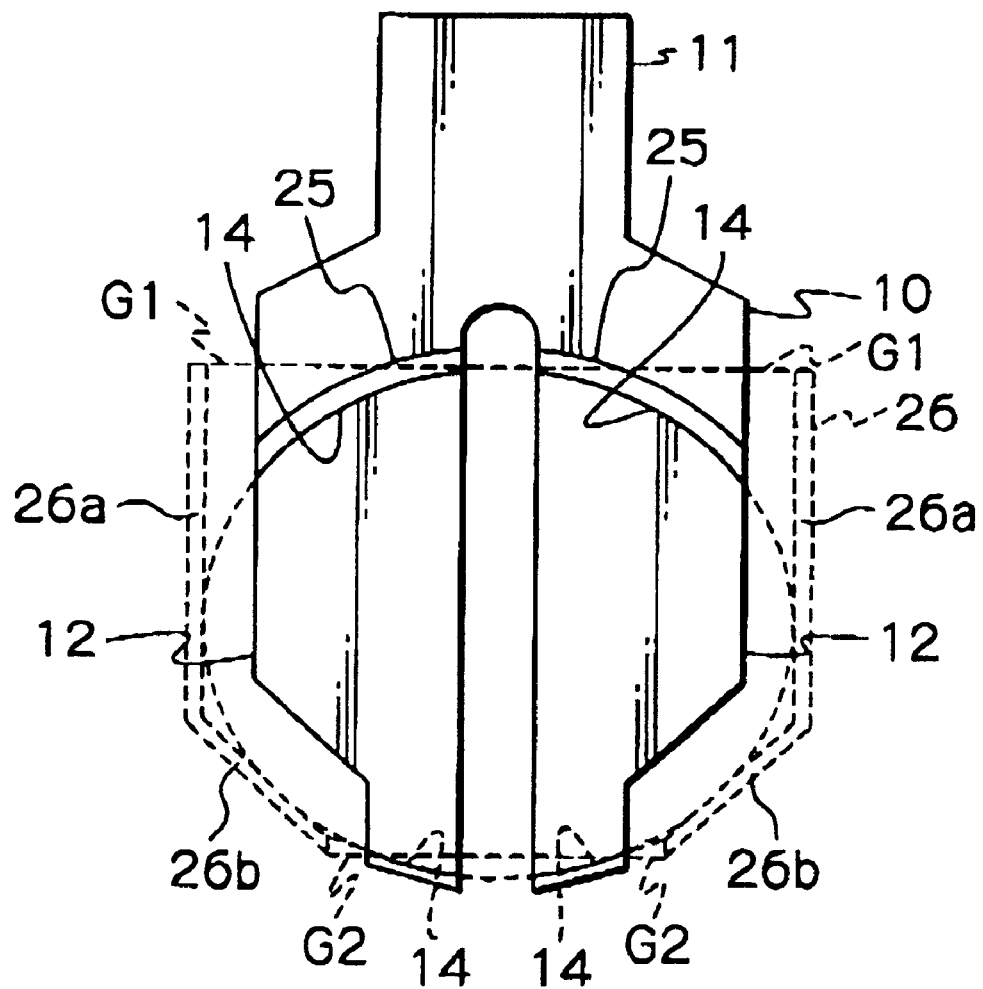
FIG. 7 is an imaginary plan view showing the substrate support member of the substrate holder of present invention which is inserted into a cassette case, together with a semiconductor wafer normally placed in the recessed area of the substrate support member.

FIG. 7 shows a stated in which a wafer W is placed in the recessed area 14 of the substrate support member 10 which has been inserted into a cassette case 26. As viewed from the top, the cassette case 26 has an inner space formed by side walls 26a, which are disposed in parallel to the direction of insertion of the substrate support member 10, and side walls 26b, which are inclined at a position forward in the direction of insertion of the substrate support member 10. The wafer W is contained in this space. When the substrate support member 10 is horizontally inserted into this space, a clearance G1 and a clearance G2 each having predetermined dimensions are formed between the outer peripheral surface of the finger portion 12 and the side wall 26a and between the outer peripheral surface of the finger portion 12 and the side wall 26b. That is, the finger portions 12 are formed so as to have a smaller width at a forward end portion thereof and have a larger width at a rear end portion thereof.

The aligning member 25 is made as long as possible in a circumferential direction. The aligning member 25 appropriately positions the wafer W in the cassette case by moving an edge of the wafer W from one direction so that the other edge of the wafer W abuts against the side walls 26b of the cassette case 26. Thus, an alignment function of aligning the wafer with a regular position is enhanced. It is advantageous to increase the length in the circumferential direction of the aligning member 25 when a semiconductor wafer having a non-flat orientation is treated.

Figure 8A:
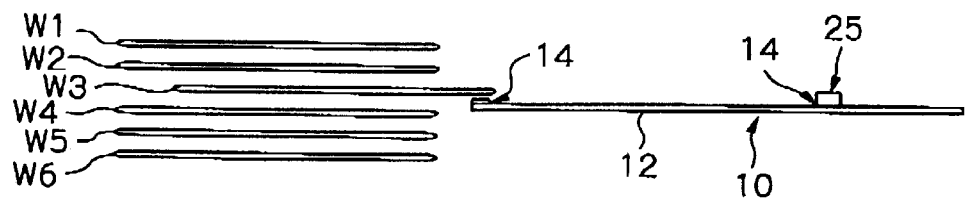
FIGS. 8(a)–8(f) show an operation for removing a semiconductor wafer contained in a cassette case by means of the substrate support member of the substrate holder of the present invention.
Figure 8B:
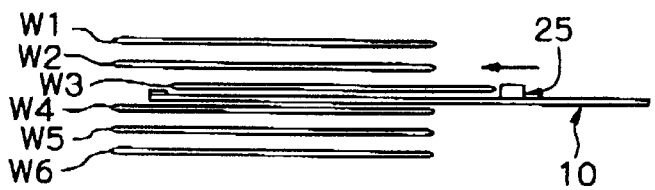
Figure 8C:
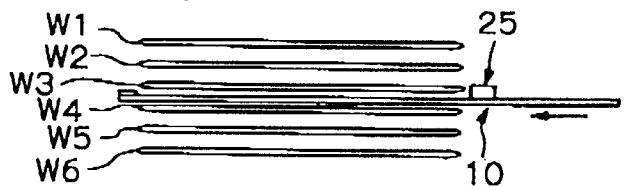

FIGS. 8a–8f show an operation for removing the wafer W. First, as shown in FIG. 8(a), the substrate support member 10 is aligned to a position between the wafer W3 and a wafer W4. Thereafter, as shown in FIGS. 8(b) and 8(c), the substrate support member 10 is inserted into a space between the wafers W3 and W4.

In this instance, if the wafer W3 is displaced from a regular position in the cassette case in a direction toward the substrate support member 10, the inner circumferential surface of the aligning member 25 abuts against an edge of the wafer W3 and moves the wafer W3 forward in accordance with the substrate support member 10. Consequently, the edge of the wafer W3 which has abutted against the inner circumferential surface of the aligning member 25 is corrected in attitude and advances to a position such as shown in FIG. 7 and FIG. 8(c). The edge of the wafer W3 abuts against the side walls 26b of the cassette case 26, to thereby position the wafer W3 at the regular position in the cassette case.

Figure 8D:
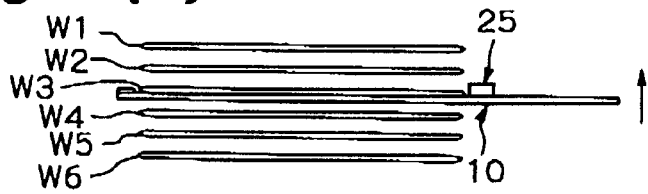
Figure 8E:
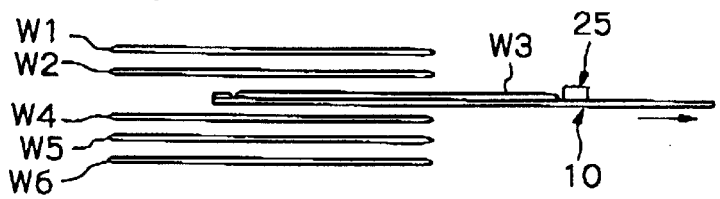
Figure 8F:
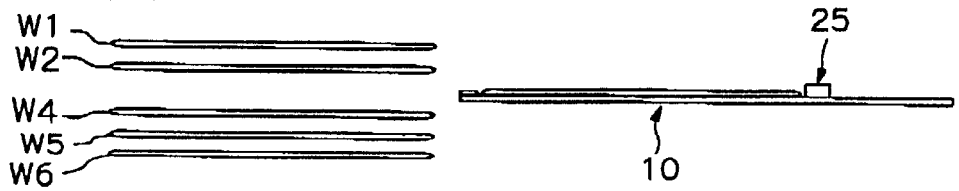

When the substrate support member 10 reaches a position directly below the regular position of the wafer W3 shown in FIG. 8(c), the substrate support member 10 is moved upward [as shown in FIG. 8(d)] by a predetermined distance so that the wafer W3 is placed in the recessed area 14. In this state, the substrate support member 10 is retracted [as shown in FIGS. 8(e) and 8(f)], to thereby remove the wafer W3. Thus, by providing the aligning member 25 in the substrate support member 10, the substrate support member 10 performs the aligning function relative to the wafer W at the time of receiving the wafer W. Consequently, the wafer W is positioned at the regular position in the cassette case and placed in the recessed area 14 of the substrate support member 10.

Figure 9A:
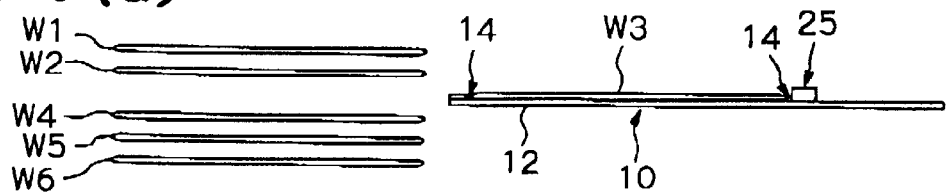
FIGS. 9(a)–9(f) show an operation for delivering a semiconductor wafer into a cassette case by means of the substrate support member of the substrate holder of the present invention.
Figure 9B:
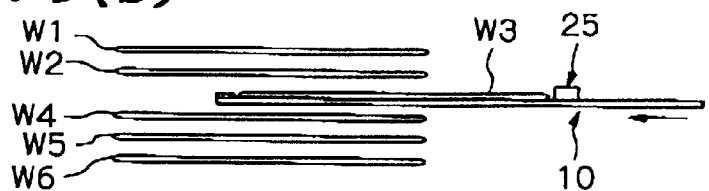
Figure 9C:
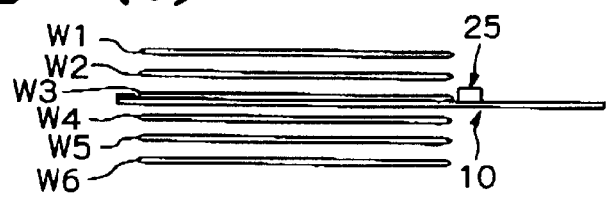

FIGS. 9a–9f show an operation for delivering the wafer W into a cassette case (not shown) by means of the substrate support member 10 of the substrate holder shown in FIGS. 6a–6d. In FIGS. 9a–9f the wafer W3 is delivered. First, as shown in FIG. 9(a), while the wafer W3 is held in the recessed area. 14 of the substrate support member 10, the substrate support member 10 is aligned with a position at which the wafer W3 is to be accommodated between a wafer W2 and the wafer W4 in the cassette case. Thereafter, as shown in FIGS. 9(b) and 9(c), the substrate support member 10 is inserted into a space for accommodating the wafer W3.

Figure 9D:
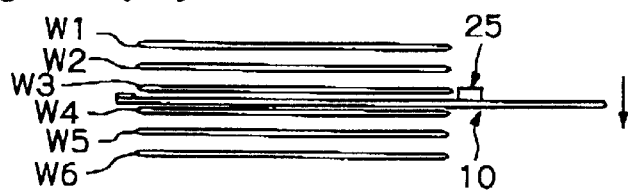
Figure 9E:
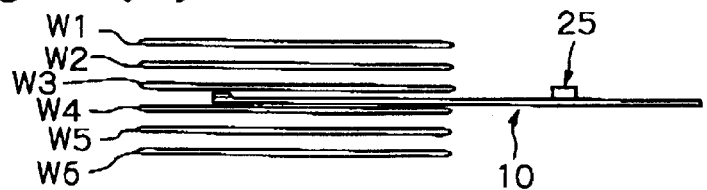
Figure 9F:
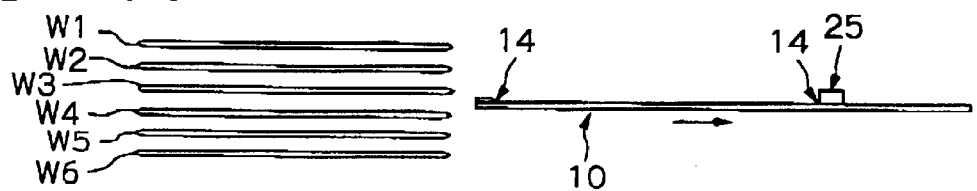

When the substrate support member 10 reaches the position for accommodating the wafer W3 in FIG. 9(c), the substrate support member 10 is lowered [as shown in FIG. 9(d)] by a predetermined distance and is retracted as shown in FIGS. 9(e) and 9(f), to thereby accommodate the wafer W3 in the cassette case. Thus, the wafer can be accommodated at the regular position by advancing the substrate support member 10 to a desired position for accommodating the wafer in the cassette case while the wafer is placed in the recessed area 14 of the substrate support member 10, and lowering the substrate support member 10 by a predetermined distance when the substrate support member 10 reaches the desired position.

Figure 10:
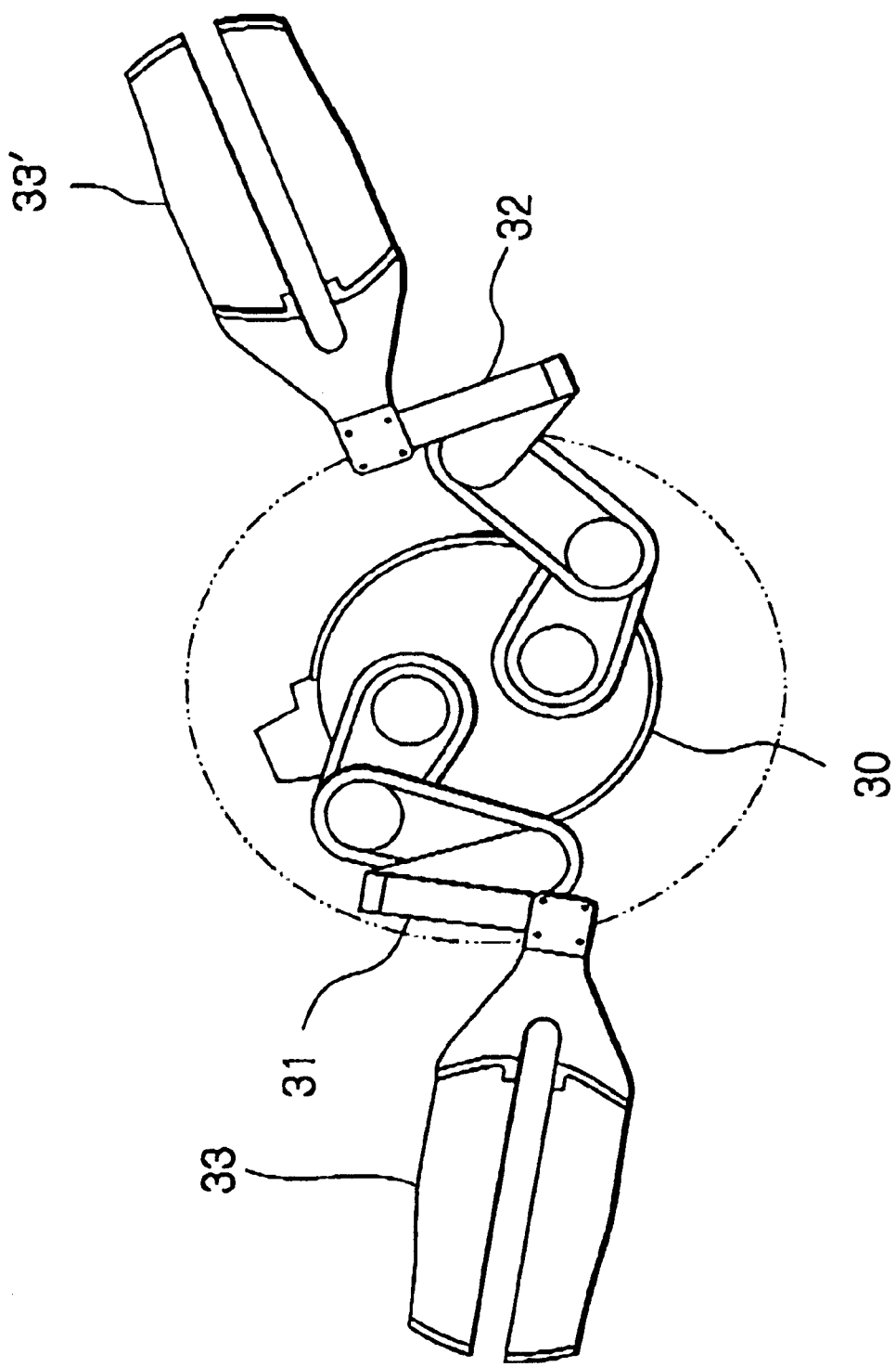
FIG. 10 is a plan view of a substrate transfer apparatus of the present invention.

FIG. 10 is a plan view of a substrate transfer apparatus comprising a robot arm having a forward end portion thereof attached to the substrate holder of the present invention. As shown in FIG. 10, this substrate transfer apparatus comprises two arms 31 and 32. Substrate holders 33 and 33' shown in FIGS. 2a–2c or FIGS. 6a–6d are attached to respective forward end portions of the robot arms 31 and 32.

Figure 11:
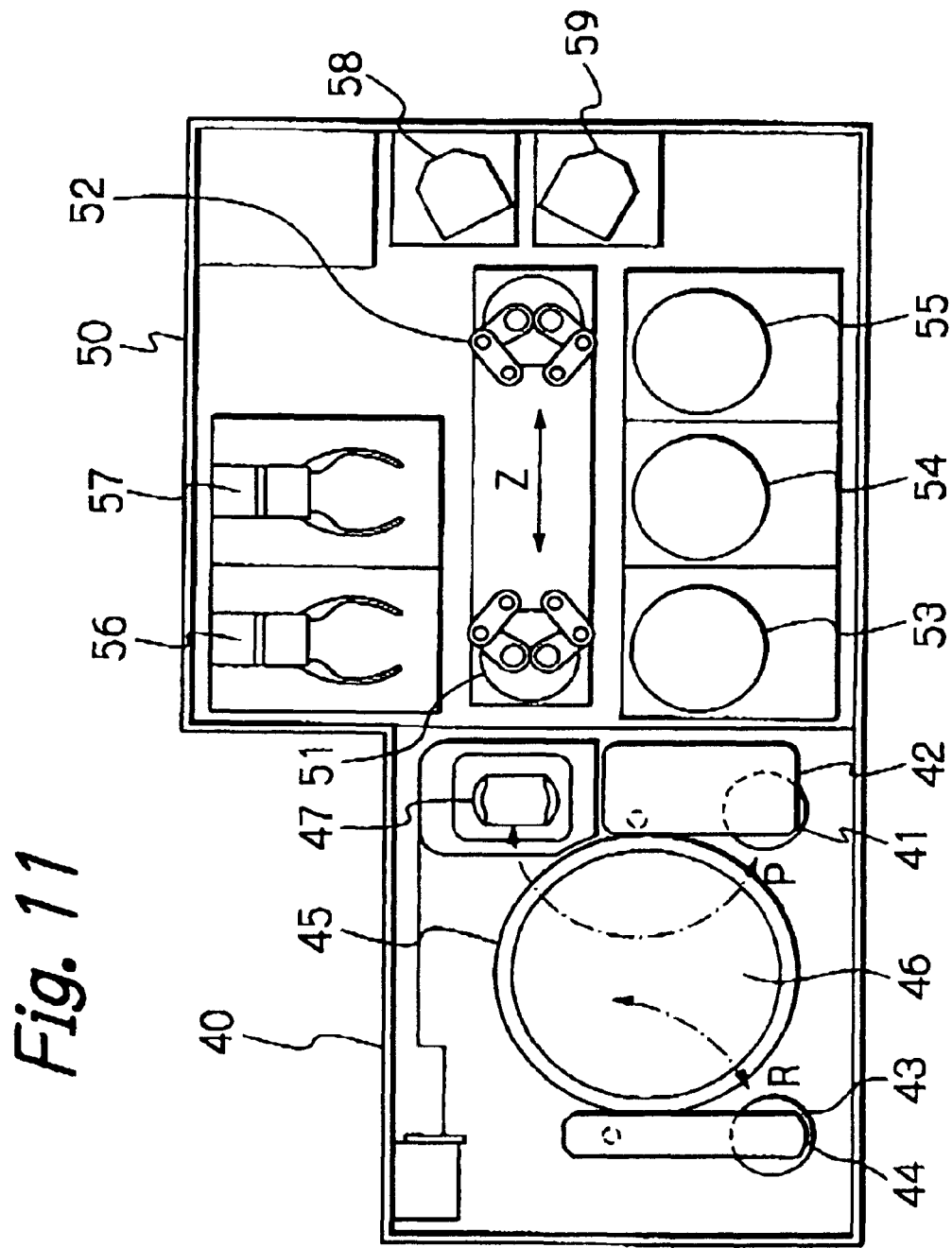
FIG. 11 is a plan view of a polishing apparatus using the substrate transfer apparatus of the present invention.

FIG. 11 is a plan view of an example of a polishing apparatus in which the substrate transfer apparatus of FIG. 10 is utilized. As shown in FIG. 11, the polishing apparatus comprises a polishing section 40 and a cleaning section 50. The polishing section 40 comprises a polishing unit 42 having a wafer carrier 41 disposed on one side of a turntable 45 and a dressing unit 44 having a dressing tool 43 disposed on the other side of the turntable 45. A workpiece transmittal device 47 is also disposed at a side of the turntable 45.

The cleaning section 50 comprises two substrate transfer apparatuses 51 and 52 disposed at a central portion thereof, each of which is arranged as shown in FIG. 10 and is capable of moving in a direction indicated by an arrow Z. A primary cleaning device 53, a secondary cleaning device 54 and a spin drier (or a spin drier having a cleaning function) 55 are disposed in parallel on one side of the substrate transfer apparatuses 51 and 52. A wet workpiece inverting device 56 and a dry workpiece inverting device 57 are disposed in parallel on the other side of the substrate transfer apparatuses 51 and 52.

Figure 12:
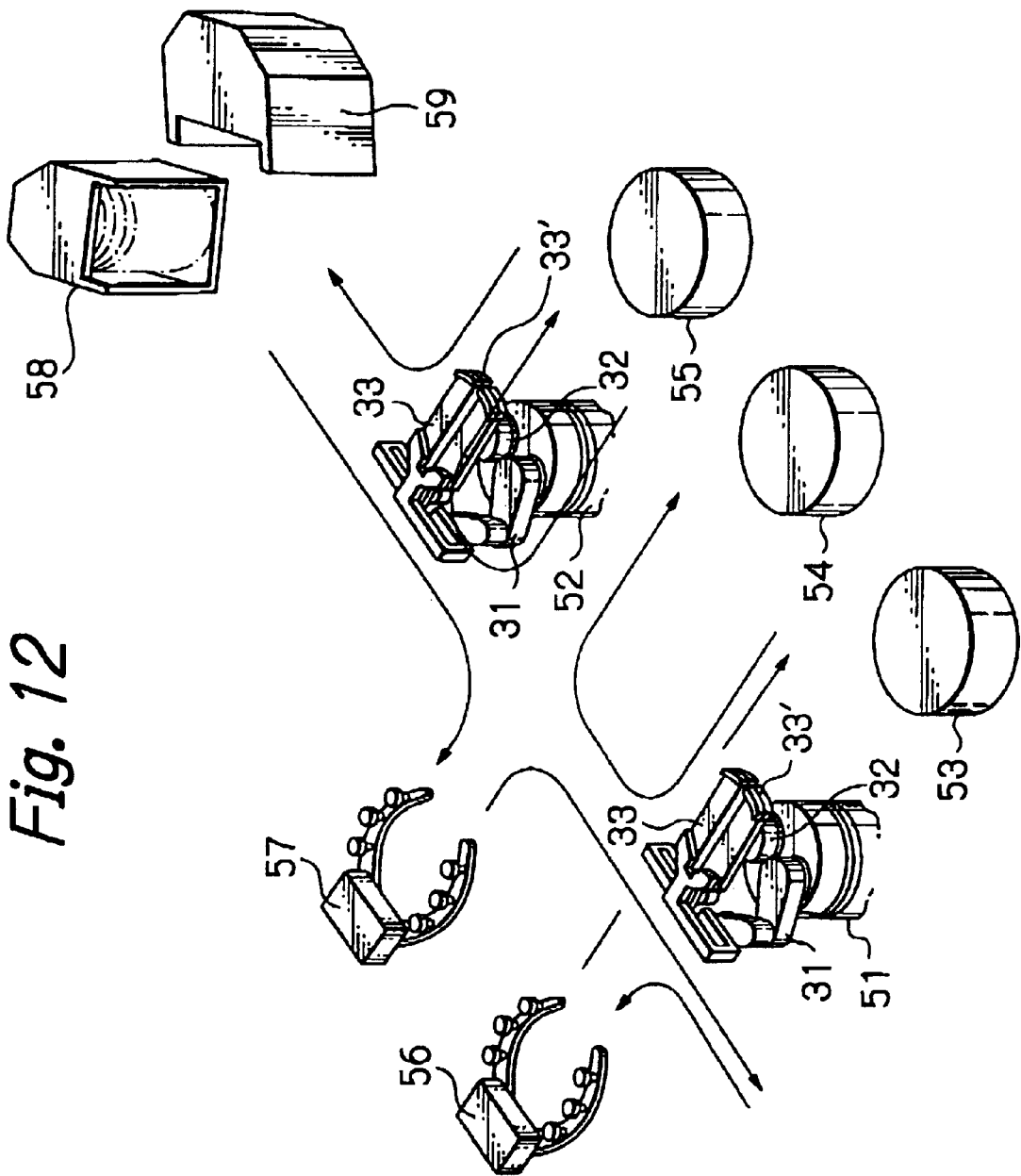
FIG. 12 is a perspective view of an essential part of a cleaning portion of the polishing apparatus of FIG. 11.

FIG. 12 is a perspective view of an essential part of the cleaning section 50. As shown in FIG. 12, each of the substrate transfer apparatuses 51 and 52 has the two arms 31 and 32. The substrate holders 33 and 33' are attached to respective forward end portions of the robot arms 31 and 32. It should be noted that the substrate holder 33 and the substrate holder 33' are disposed in a vertically overlapping manner.

In the polishing apparatus shown in FIGS. 11 and 12, when a cassette case 58 for containing semiconductor wafers W before polishing is set at a position such as shown in FIG. 12, the upper substrate holder 33 of the substrate transfer apparatus 52 removes the wafers W from the cassette case 58 one after another. The wafer removed by the substrate holder 33 is delivered to the dry workpiece inverting device 57, where the wafer is inverted. Then, the wafer on the dry workpiece inverting device 57 is received by the upper substrate holder 33 of the substrate transfer apparatus 51 and transferred to the workpiece transmittal device 47 of the polishing section 40.

The wafer W in the workpiece transmittal device 47 is held by a wafer carrier 41 of the polishing unit 42. The wafer carrier 41 pivotally moves in a direction as indicated by an arrow P, to thereby move the wafer W over the turntable 45 so that the wafer W is polished by a polishing surface 46 which is rotating. During polishing, an abrasive liquid is supplied from an abrasive liquid supply nozzle (not shown) onto the polishing surface 46.

After polishing, the wafer W is returned to the workpiece transmittal device 47. By means of the lower substrate holder 33' of the substrate transfer apparatus 51, the wafer W is delivered to the wet workpiece inverting device 56, where the wafer W is inverted while being rinsed with a rinsing liquid. Thereafter, the wafer W is transferred to the primary cleaning device 53 by the lower substrate holder 33' of the substrate transfer apparatus 51 and is cleaned. Further, by means of the lower substrate holder 33' of the substrate transfer apparatus 51, the wafer W is transferred to the secondary cleaning device 54 and is cleaned. Then, the wafer W is transferred to the spin drier 55 by the lower substrate holder 33' of the substrate transfer apparatus 52. The wafer W is spin-dried by the spin drier 55 and delivered, by means of the -upper substrate holder 33 of the substrate transfer apparatus 52, into a cassette case 59 for containing polished and cleaned wafers.

In FIG. 11, the substrate holder of the present invention is applied to both the substrate transfer apparatus 51 and the substrate transfer apparatus 52. However, the substrate holder of the present invention may not be applied to the substrate transfer apparatus 51, because the substrate transfer apparatus 51 does not serve to remove or deliver wafers relative to the cassette cases 58 and 59 and, thus, no high accuracy of the depth of the recessed area is required. Further, because the wafer W is positioned in the workpiece transmittal device 47, the workpiece inverting device 56 and the cleaning devices 53 and 54, the wafer W can be easily received from those devices. Therefore, the substrate holder of the present invention should be applied to at least the substrate transfer apparatus 52 which delivers wafers relative to the cassette cases 58 and 59.

Figure 13:
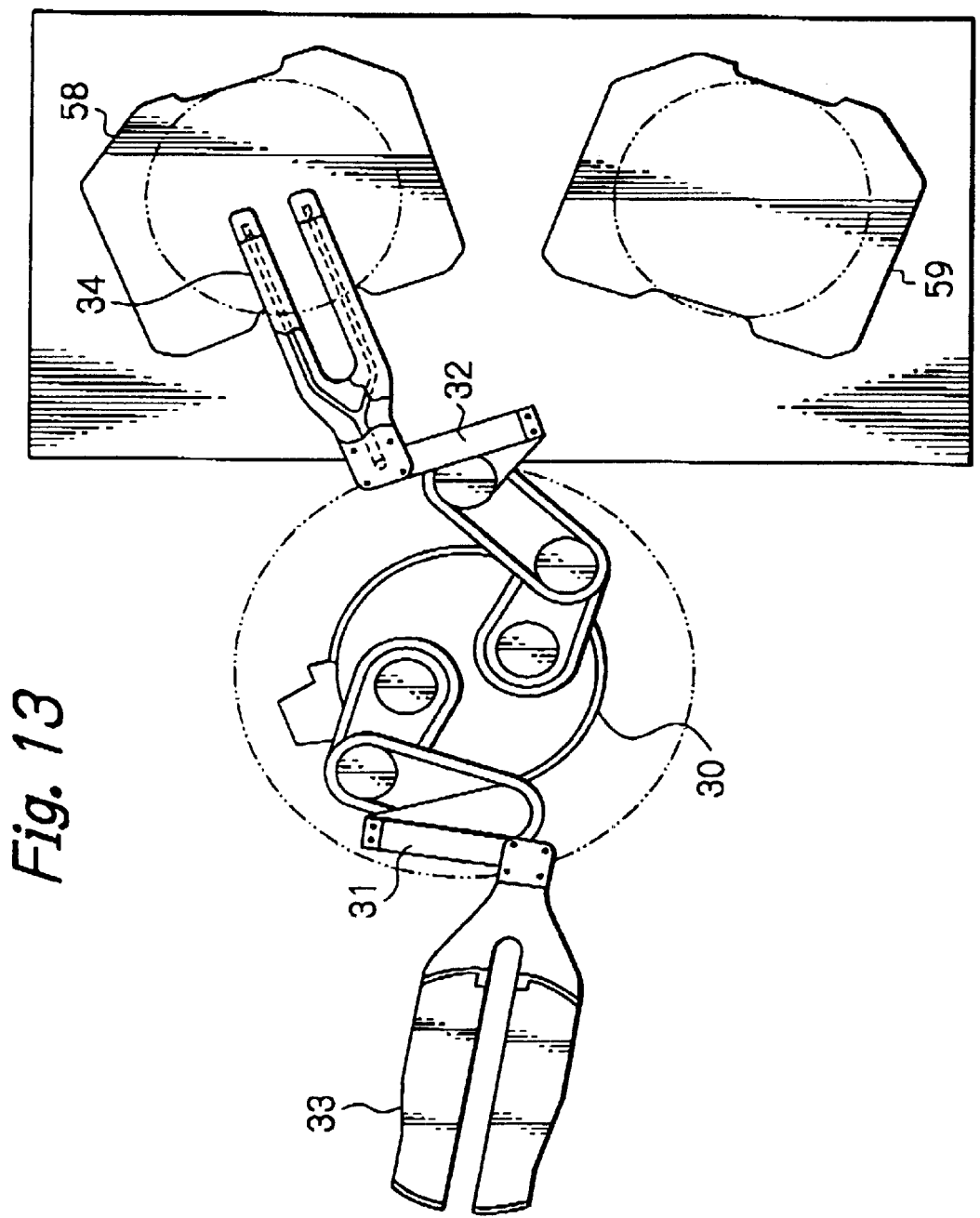
FIG. 13 is a plan view of another example of a substrate transfer apparatus of the present invention.

FIG. 13 shows another example of an arrangement of the substrate transfer apparatus of the present invention. As shown in FIG. 13, of the two arms 31 and 32 of a robot 30, one arm 31 is attached at the forward end portion thereof to the recessed type substrate holder shown in FIGS. 2a–2c or FIGS. 6a–6d, and the other arm 32 is attached at the forward end portion thereof to a conventional suction substrate holder 34 which is arranged as shown in FIGS. 1a–1b.

In this substrate transfer apparatus, the arm 32 of the robot 30 is operated, to thereby remove a pre-treated semiconductor wafer W from the cassette case 58 by means of the suction type substrate holder 34 and transfers the wafer W to the cleaning section 50 of the polishing apparatus (reference is made to FIG. 11). On the other hand, the wafer W which has been polished by the polishing section 40 and cleaned and dried by the cleaning section 50 is received by the recessed type substrate holder 33 of the present invention attached to the arm 31. The wafer is then transferred to and accommodated in the cassette case 59 for containing polished wafers.

The wafers W are not precisely positioned in the cassette case 58. Therefore, when the wafer W is removed from the cassette case 58 by the recessed type substrate holder 33 of the present invention, it is necessary for the substrate holder 33 to conduct alignment of the holder relative to the wafer W in the substrate holder 33, with the result that a comparatively large amount of alignment is required as compared to the removal of the wafer from other units (when the wafer W is removed from the workpiece Inverting devices 56 and 57 and the cleaning devices 53 and 54, the wafer W is already aligned in those devices, so that it is unnecessary to conduct alignment to a large extent in the substrate holder 33). Therefore, the substrate holder 33 must be increased in size in consideration of alignment. When a mechanism for alignment of the wafer W after removal from the cassette case 58 (such as the workpiece inverting devices 56 and 57) is provided, the suction type substrate holder 34 can be suitably used for removal of the wafer from the cassette case 58. Further, the wafer W to be removed from the cassette case 58 is unpolished, so that contamination of a backside of the wafer W due to contact with the holder is not problematic.

As shown in FIG. 4a, a pre-treated wafer W in the cassette case 58 can be slightly inclined even if it is supported by the mount portions 21a which are positioned at the opposite sides of the cassette case at the same level, or can be laid between the upper mount portion 21a and the lower mount portion 21a which is located on a side opposite to the upper mount portion 21a. Even when the wafer W is disposed in the cassette case 58 in the above-mentioned state, the suction type substrate holder 34 is capable of surely holding the wafer W by applying a vacuum pressure to a central portion of the backside of the wafer W.

In the suction type substrate holder 34, particles in the air are collected at the central portion of the backside of the wafer W due to the effect of suction, leading to contamination of this portion of the wafer. However, this contamination is not problematic because the wafer W held by the suction type substrate holder 34 is a pre-treated wafer.

In the substrate holder having the substrate support member 10 shown in FIGS. 6a–6d, an aligning mechanism having the aligning member 25 is provided. Therefore, even when the substrate support member 10 is inserted into the cassette case 58 so as to receive a wafer W which is displaced from the regular position in the cassette case 58, an alignment function of moving the wafer W to the regular position can be performed. Therefore, a substrate holder, having the substrate support member 10 shown in FIGS. 6a–6d may be used as both the substrate holder 33 and the substrate holder 34.

On the other hand, a treated semiconductor wafer W which has been polished by the polishing section 40 and cleaned and dried by the cleaning section 50 is received by the recessed type substrate holder 33 of the present Invention attached to the robot arm 31. Therefore, only the outer circumferential portion of the backside of the wafer W abuts against the substrate mount portions 15, so that no other portions of the wafer W make contact with the substrate holder. Therefore, the risk of contamination can be extremely suppressed.

In the above-mentioned example, one robot has two arms 31 and 32. However, the number of arms of the robot to be used in the substrate transfer apparatus of the present invention is not particularly limited. The robot may have one or more arms, as long as at least one arm is arranged to be attached to the recessed type substrate holder of the present invention.

Further, a substrate holder in accordance with the present invention can be incorporated into various types of apparatuses including, for example, a plating apparatus, wherein substrates including semiconductor wafers are treated.

According to the embodiments of the present invention as stated above, various advantages such as noted below are obtained.

(1) Displacement of the substrate and breakage of the substrate due to falling from the holder can be avoided without using a vacuum pressure.

(2) Because only the outer circumferential portion of the backside of the substrate abuts against the substrate mount portion, it is possible to minimize contamination of the substrate due to deposition of particles at the portion of the backside of the substrate which does not abut against the substrate mount portion.

(3) Differing from the conventional technique is detected which the presence or absence of the substrate is detected according to a change in vacuum pressure, there is no possibility of contamination of a substrate due to collection and deposition of particles floating in air.

(4) Further, when a detection means of a non-contact type, such as a photoelectric sensor 24, is used for detecting the substrate, the detection means detects the presence or absence of the substrate in the recessed area without making contact with the substrate. This enables rapid detection of a change in attitude of the substrate, which can lead to falling of the substrate from the holder during transfer and is thus advantageous in preventing breakage of the substrate due to falling from the holder.

(5) Further, when the pressure detecting opening 16 is connected to a vacuum source during transfer of the substrate, lifting of the substrate (hence displacement of the substrate) can be suppressed. In this case, a high vacuum pressure is not required and only the outer circumferential portion of the backside of the substrate is suctioned, so that contamination of the substrate due to particles can be suppressed. Further, even when the outer circumferential portion of the backside of the substrate is contaminated with particles, a relatively low effect is exerted on a product yield, as compared to contamination of the central portion of the substrate.

What is claimed is:

1. A substrate holder for holding and transferring a thin substrate, comprising:
    a substrate support member having a recessed area for receiving a thin substrate therein, and substrate mount portions in said recessed area adjacent to a circumferential edge of said recessed area, said substrate mount portions being adapted to be engaged with an outer circumferential portion of a backside of the thin substrate when the thin substrate is received in said recessed area; and
    a substrate detector for detecting a presence or absence of the thin substrate in said recessed area, wherein said substrate detector comprises a first detection mechanism including:
        (i) a substrate detecting portion in said recessed area adjacent to the circumferential edge of said recessed area, said substrate detecting portion having a surface with which the outer circumferential portion of the backside of the thin substrate is to be engaged when the thin substrate is received in said recessed area;
        (ii) a gas passage provided in the substrate holder, said gas passage defining an opening in said surface of said substrate detecting portion; and
        (iii) a gas source in fluid communication with said gas passage,
        wherein said first detection mechanism is constructed and arranged to detect the presence or absence of the thin substrate in said recessed area by detecting a gas pressure in said opening.

2. The substrate holder according to claim 1, wherein said substrate detector further comprises a second detection mechanism of a non-contact type which is constructed and arranged to detect the presence or absence of the thin substrate in said recessed area without making contact with the thin substrate.

3. The substrate holder according to claim 1, wherein said substrate support member further has a first portion adapted to be connected to a portion of a substrate transfer apparatus and a second portion in which said recessed area is present, said second portion including a proximal section adjacent to said first portion and having a first width, and also including a distal section removed from said first portion and having a second width that is less than said first width.

4. The substrate holder according to claim 1 further comprising:
    an aligning mechanism constructed and arranged to move the thin substrate from an offset position to a regular position when the thin substrate is at the offset position and said substrate support member is moved beneath the thin substrate from the offset position to the regular position such that said substrate support member is enabled to accurately receive the thin substrate in said recessed area at the regular position.

5. The substrate holder according to claim 4, wherein said aligning mechanism comprises an alignment member provided outside of and adjacent to said recessed area of said substrate support member such that when said substrate support member is moved beneath the thin substrate from the offset position to the regular position, said aligning member engages and moves the thin substrate to the regular position.

6. The substrate holder according to claim 5, wherein said alignment member includes a surface that is non-inclined relative to a direction in which said substrate support member is to move from the offset position to the regular position, and wherein the non-inclined surface is to engage and move the thin substrate to the regular position when said substrate support member is moved beneath the thin substrate from the offset position to the regular position.

7. The substrate holder according to claim 5, wherein said substrate detector further comprises a second detection mechanism of a non-contact type which is constructed and arranged to detect the presence or absence of the thin substrate in said recessed area without making contact with the thin substrate.

8. The substrate holder according to claim 4, wherein said substrate detector further comprises a second detection mechanism of a non-contact type which is constructed and arranged to detect the presence or absence of the thin substrate in said recessed area without making contact with the thin substrate.

9. A substrate holder for holding and transferring a thin substrate, comprising:
   a substrate support member having a recessed area for receiving a thin substrate therein; and
   an aligning mechanism constructed and arranged to move the thin substrate from an offset position to a regular position when the thin substrate is at the offset position and said substrate support member is moved beneath the thin substrate from the offset position to the regular position such that said substrate support member is enabled to accurately receive the thin substrate in said recessed area at the regular position.

10. The substrate holder according to claim 9, wherein said aligning mechanism comprises an alignment member provided outside of and adjacent to said recessed area of said substrate support member such that when said substrate support member is moved beneath the thin substrate from the offset position to the regular position, said aligning member engages and moves the thin substrate to the regular position.

11. The substrate holder according to claim 10, wherein said alignment member includes a surface that is non-inclined relative to a direction in which said substrate support member is to move from the offset position to the regular position, and wherein the non-inclined surface is to engage and move the thin substrate to the regular position when said substrate support member is moved beneath the thin substrate from the offset position to the regular position.

12. A substrate transfer apparatus for transferring a substrate from a first position to a second position, comprising:
   a substrate holder for holding a substrate, said substrate holder being adapted to be moved from a first position to a second position for transfer of the substrate, wherein said substrate holder comprises:
      (i) a substrate support member having a recessed area for receiving the substrate therein;
      (ii) substrate mount portions in said recessed area adjacent to a circumferential edge of said recessed area, said substrate mount portions being adapted to be engaged with an outer circumferential portion of a backside of the substrate when the substrate is received in said recessed area; and
      (iii) a substrate detector for detecting a presence or absence of the substrate in said recessed area, wherein said substrate detector comprises a first detection mechanism including:
         (a) a substrate detecting portion in said recessed area adjacent to the circumferential edge of said recessed area, said substrate detecting portion having a surface with which the outer circumferential portion of the backside of the substrate is to be engaged when the substrate is received in said recessed area;
         (b) a gas passage provided in the substrate holder, said gas passage defining an opening in said surface of said substrate detecting portion; and
         (c) a gas source in fluid communication with said gas passage,
      wherein said first detection mechanism is constructed and arranged to detect the presence or absence of the substrate in said recessed area by detecting a gas pressure in said opening.

13. The substrate transfer apparatus according to claim 12, wherein said substrate detector further comprises a second detection mechanism of a non-contact type which is constructed and arranged to detect the presence or absence of the substrate in said recessed area without making contact with the substrate.

14. The substrate transfer apparatus according to claim 12, wherein said substrate support member further has a first portion adapted to be connected to a portion of the substrate transfer apparatus and a second portion in which said recessed area is present, said second portion including a proximal section adjacent to said first portion and having a first width, and also including a distal section removed from said first portion and having a second width that is less than said first width.

15. The substrate transfer apparatus according to claim 12, wherein said substrate holder further comprises an aligning mechanism constructed and arranged to move the substrate from an offset position to a regular position when the substrate is at the offset position and said substrate support member is moved beneath the substrate from the offset position to the regular position such that substrate support member is enabled to accurately receive the substrate in said recessed area at the regular position.

16. The substrate transfer apparatus according to claim 15, wherein said aligning mechanism comprises an alignment member provided outside of and adjacent to said recessed area of said substrate support member such that when said substrate support member is moved beneath the substrate from the offset position to the regular position, said aligning member engages and moves the substrate to the regular position.

17. The substrate transfer apparatus according to claim 16, wherein said alignment member includes a surface that is non-inclined relative to a direction in which said substrate support member is to move from the offset position to the regular position, and wherein the non-inclined surface is to engage and move the substrate to the regular position when said substrate support member is moved beneath the substrate from the offset position to the regular position.

18. A substrate transfer apparatus for transferring a substrate from a cassette case that is to receive a plurality of substrates to a position outside of the cassette case, comprising:
   a movable substrate holder to hold and transfer a substrate, said movable substrate holder including an alignment member constructed and arranged to move the substrate from an offset position to a regular position when the substrate is at the offset position and said movable substrate holder is moved beneath the substrate from the offset position to the regular position such that said movable substrate holder is enabled to accurately receive the substrate at the regular position.

19. The substrate transfer apparatus according to claim 18, wherein said alignment member includes a surface that is non-inclined relative to a direction in which said movable substrate holder is to move from the offset position to the regular position, and wherein the non-inclined surface is to engage and move the substrate to the regular position when said substrate support member is moved beneath the substrate from the offset position to the regular position.

20. The substrate transfer apparatus according to claim 18, wherein said movable substrate holder further includes a recessed area for receiving the substrate therein, and said alignment member is positioned outside of and adjacent to said recessed area.

21. The substrate transfer apparatus according to claim 20, wherein said alignment member includes a surface that is non-inclined relative to a direction in which said movable substrate holder is to move from the offset position to the regular position, and wherein the non-inclined surface is to engage and move the substrate to the regular position when said substrate support member is moved beneath the substrate from the offset position to the regular position.

* * * * *